United States Patent
Bae et al.

(10) Patent No.: US 8,575,637 B2
(45) Date of Patent: Nov. 5, 2013

(54) ULTRAVIOLET LIGHT EMITTING DIODE PACKAGE

(75) Inventors: Jeong Suk Bae, Ansan-si (KR); Jae Jo Kim, Ansan-si (KR); Do Hyung Kim, Ansan-si (KR); Dae Sung Kal, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 13/277,706

(22) Filed: Oct. 20, 2011

(65) Prior Publication Data
US 2012/0032223 A1 Feb. 9, 2012

Related U.S. Application Data

(63) Continuation of application No. 12/443,380, filed as application No. PCT/KR2007/004480 on Sep. 18, 2007, now Pat. No. 8,067,778.

(30) Foreign Application Priority Data

Sep. 28, 2006 (KR) .................. 10-2006-0094917
Sep. 29, 2006 (KR) .................. 10-2006-0095847
Sep. 29, 2006 (KR) .................. 10-2006-0095849

(51) Int. Cl.
*H01L 33/00* (2010.01)
(52) U.S. Cl.
USPC .................. 257/98; 257/76; 257/E33.06
(58) Field of Classification Search
USPC .................. 257/76, 98, E33.06
See application file for complete search history.

(56) References Cited

U.S. PATENT DOCUMENTS

| | | | |
|---|---|---|---|
| 4,733,067 A * | 3/1988 | Oinoue et al. | 250/216 |
| 5,500,768 A * | 3/1996 | Doggett et al. | 359/652 |
| 6,274,924 B1 | 8/2001 | Carey | |
| 7,105,863 B1 | 9/2006 | Ng et al. | |
| 2002/0113244 A1* | 8/2002 | Barnett et al. | 257/98 |
| 2003/0160256 A1* | 8/2003 | Durocher et al. | 257/88 |
| 2003/0230757 A1* | 12/2003 | Suehiro et al. | 257/99 |
| 2005/0212008 A1 | 9/2005 | Miyoshi | |
| 2005/0230691 A1* | 10/2005 | Amiotti et al. | 257/79 |
| 2006/0133044 A1 | 6/2006 | Kim et al. | |
| 2006/0206173 A1 | 9/2006 | Gertner et al. | |

FOREIGN PATENT DOCUMENTS

| | | |
|---|---|---|
| JP | 2004-158495 | 6/2004 |
| KR | 10-2006-0031030 | 4/2006 |
| KR | 10-2006-0046091 | 5/2006 |
| KR | 10-2006-0079740 | 7/2006 |
| TW | 200414572 | 8/2004 |
| TW | 200614553 | 5/2006 |

(Continued)

OTHER PUBLICATIONS

TW Preliminary Notice of Final Office Action issued on Aug. 22, 2012 in corresponding Taiwanese Application No. 100142151.

(Continued)

*Primary Examiner* — Tan N Tran
(74) *Attorney, Agent, or Firm* — H.C. Park & Associates, PLC

(57) ABSTRACT

An ultraviolet light emitting diode package for emitting ultraviolet light is disclosed. The ultraviolet light emitting diode package comprises an LED chip emitting light with a peak wavelength of 350 nm or less, and a protective member provided so that surroundings of the LED chip is covered to protect the LED chip, the protective member having a non-yellowing property to energy from the LED chip.

16 Claims, 13 Drawing Sheets

(56) References Cited

FOREIGN PATENT DOCUMENTS

TW          I260801          8/2006

OTHER PUBLICATIONS

International Search Report of PCT/KR2007/004480 dated Dec. 28, 2007.

Written Opinion of PCT/KR2007/004480 dated Dec. 28, 2007.
Preliminary Notice of the First Office Action of Taiwanese Application No. 96135916 issued on Feb. 25, 2011.
Non-Final Office Action of U.S. Appl. No. 12/443,380 issued on Mar. 24, 2011.
Notice of Allowance of U.S. Appl. No. 12/443,380 issued on Sep. 12, 2011.

* cited by examiner (a)

(b)

(a)

(b)

ULTRAVIOLET LIGHT EMITTING DIODE PACKAGE

CROSS REFERENCE TO RELATED APPLICATIONS

This application is a continuation of U.S. patent application Ser. No. 12/443,380, filed on Mar. 27, 2009, which is the National Stage of International Application No. PCT/KR2007/004480, filed on Sep. 18, 2007, and claims priority from and the benefit of Korean Patent Application No. 10-2006-0094917, filed on Sep. 28, 2006, Korean Patent Application No. 10-2006-0095847, filed on Sep. 29, 2006, and Korean Patent Application No. 10-2006-0095849, filed on Sep. 29, 2006, which are all hereby incorporated by reference for all purposes as if fully set forth herein.

BACKGROUND OF THE INVENTION

1. Field of the Invention

The present invention relates to an ultraviolet light emitting diode package, and more particularly, to an ultraviolet light emitting diode package including a light emitting diode chip for emitting light with a peak wavelength of 350 nm or less.

2. Discussion of the Background

Recently, a light emitting diode (LED) has been used for various applications including light sources for illumination, sterilization, purification and medical treatment. In order to use an LED as a light source for illumination, the LED is required to have luminous power of a few tens lumens or more. The luminous power of the LED is generally in proportion to input power. Accordingly, high luminous power can be obtained by increasing power input to the LED. However, the increase of the input power causes junction temperature of the LED to increase. The increase of the junction temperature of the LED results in decrease of photometric efficiency indicating a degree where input energy is converted into visible light. Therefore, the LED is required to have a structure for preventing the increase of the junction temperature of the LED due to the increase of the input power.

An LED package with such a structure is disclosed in U.S. Pat. No. 6,274,924B1 (entitled "Surface mounting LED package"). According the document, since an LED die is thermally coupled on a heat sink, the LED die can be maintained at a low junction temperature. Accordingly, relatively high input power can be supplied to the LED die, so that high luminous power can be obtained.

However, a light emitting diode package (hereinafter, referred to as an LED package) having such a structure, i.e., an LED package capable of obtaining high luminous power with large input power, has not been suggested in various structures and shapes. This is because the LED package has a technical difficulty in commercialization in spite of its simple structure. In particular, since it is not easy to analyze the heat generated from the LED package itself and there are few specialists therefor, the development of the LED package is restrictedly performed. However, since such an LED package is expected to be applied to not only illumination but also large-sized TVs, displays and the like, and its application fields will be extended in the future, various LED packages having superior heat dissipation characteristic are required to have structures and shapes different from a conventional LED package.

In particular, an ultraviolet (UV) LED, which is to produce UV light with a short wavelength, has superior performance in terms of antibiosis, anti-dust, purification, sterilization and the like, so that its application area has been extended to home electronic appliances, such as air cleaners, water purifiers, refrigerators, air conditioners and dish washers, medical appliances, and the like.

A UV LED for producing UV light with a light emitting peak wavelength of 380 to 420 nm, which is a relatively long wavelength, is mainly used as a conventional UV LED. In such a peak wavelength range, the performance of UV light is degraded in terms of antibiosis, anti-dust, purification, sterilization and the like. Nevertheless, as UV light has a shorter wavelength, the performance and lifespan of an LED package including a UV LED are more degraded. For this reason, there is a limit to development of a UV LED with a short peak wavelength.

SUMMARY OF THE INVENTION

According to the result of studies, conducted by the inventors, on degradation of the performance or lifespan depending on a time when a UV LED is used, it is found that as an LED chip emit UV with a short wavelength, energy accompanied with heat increases to thereby cause a yellowing phenomenon in a sealant of a resin material (particularly, epoxy resin) formed to protect surroundings of the LED chip, so that the yellowing phenomenon causes the performance and lifespan of a UV LED package to be degraded.

Accordingly, an object of the present invention is to provide a UV LED package, wherein using an LED chip for emitting UV light with a peak wavelength of 350 nm or less, a member for protecting the LED chip includes a non-yellowing material to thereby minimize the deterioration in performance and lifespan of the LED chip depending on time.

Another object of the present invention is to provide a UV LED package including a structure in which a large amount of heat caused when producing UV with a short wavelength is easily dissipated to the outside to thereby improve performance and lifespan of the UV LED package.

A UV LED package comprises an LED chip emitting light with a peak wavelength of 350 nm or less; and a protective member provided so that surroundings of the LED chip is covered to protect the LED chip, the protective member having a non-yellowing property to energy from the LED chip. According to an embodiment of the present invention, the UV LED package may further comprise a heat dissipation member for radiating heat produced from the LED chip to an outside, wherein the heat dissipation member includes a heat sink support ring having at least two connecting terminals and a heat sink inserted into the heat sink support ring; and the LED chip is disposed on top of the heat sink.

According to another embodiment of the present invention, the UV LED package may further comprise a base and a reflective cup attached on an upper surface of the base, wherein the reflective cup includes a bottom portion on which the LED chip is mounted and a side inclined portion around the bottom portion, and the protective member is mounted to protect the LED chip inside the reflective cup.

According to a further embodiment of the present invention, the LED chip may be mounted on the base through which one or more pin-type leads pass to be assembled, and the protective member is a silicon molding member that covers the LED chip mounted on the base.

According to the embodiments of the present invention, it is possible to implement a UV LED package used to produce UV light with a short wavelength and having superior performance in terms of antibiosis, anti-dust, purification, sterilization and the like. Although high energy (particularly, heat energy) is generated when producing the UV light with a short wavelength, a yellowing phenomenon is hardly caused in a protective member around an LED chip. Accordingly, the degradation of the performance and lifespan of the LED chip depending on time can be minimized.

DETAILED DESCRIPTION OF THE ILLUSTRATED EMBODIMENTS

Other objects and advantages of the present invention will be apparently understood from descriptions of the following embodiments.

Hereinafter, although the embodiments of the present invention will be described in detail with reference to the accompanying drawings, the embodiments are provided only for illustrative purposes and the present invention is not limited to the embodiments.

Figure 1:
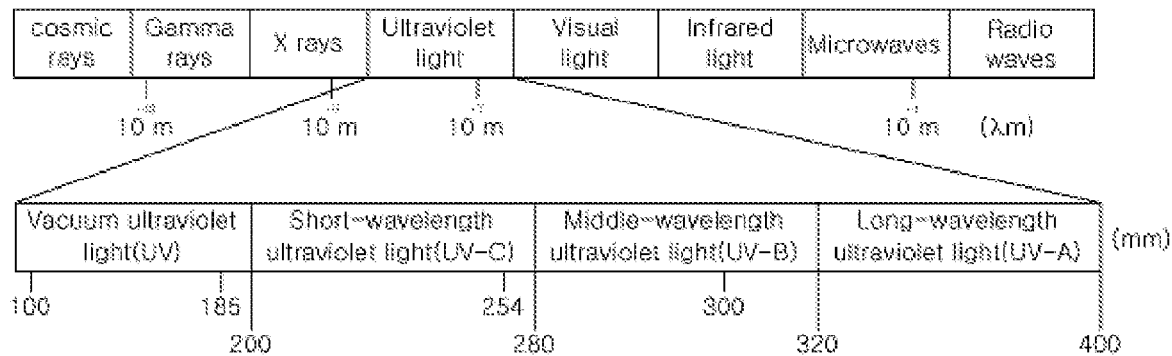
FIG. 1 is a view illustrating the kind of UV.

Referring to FIG. 1, light emitted with a peak wavelength of 350 nm or less is in a short wavelength UV range. The UV light is divided into UVA (400 to 320 nm) that has a relatively long wavelength, UVB (320 to 280 nm) that has a middle wavelength, and UVC (280 nm or less) that has a short wavelength and is referred to as a sterilization wavelength, depending on an influence on human bodies and environments. Long wavelength UV with a wavelength of over 350 nm is generally used in a package using a UV LED chip, which is because reliability may be degraded due to heat produced when UV with a wavelength of 350 or less is used and a yellowing phenomenon may be caused in resin for sealing the LED chip.

Therefore, in the present invention, a non-yellowing protective member is used to prevent a yellowing phenomenon caused when using an LED chip emitting light with a peak wavelength of 350 nm or less, and a heat radiation member is appropriately used to prevent reliability from being degraded due to heat.

Light applicable to the present invention has a short wavelength of 350 nm or less. The wavelength of the light is included in a short wavelength region of UVA and UVB and UVC regions. A heat radiation member capable of effectively dissipating heat produced from an LED chip emitting light with a peak wavelength of 350 nm or less may be used as a heat radiation member applicable to the present invention. Preferably, a protective member applicable to the present invention is formed of a limited material containing silicon resin, glass or quartz. In case of a typical epoxy resin, a yellowing phenomenon is easily caused by light emitted with a peak wavelength of 350 nm or less used in the present invention. A non-yellowing protective member can be applied to prevent the yellowing phenomenon.

Figure 2:
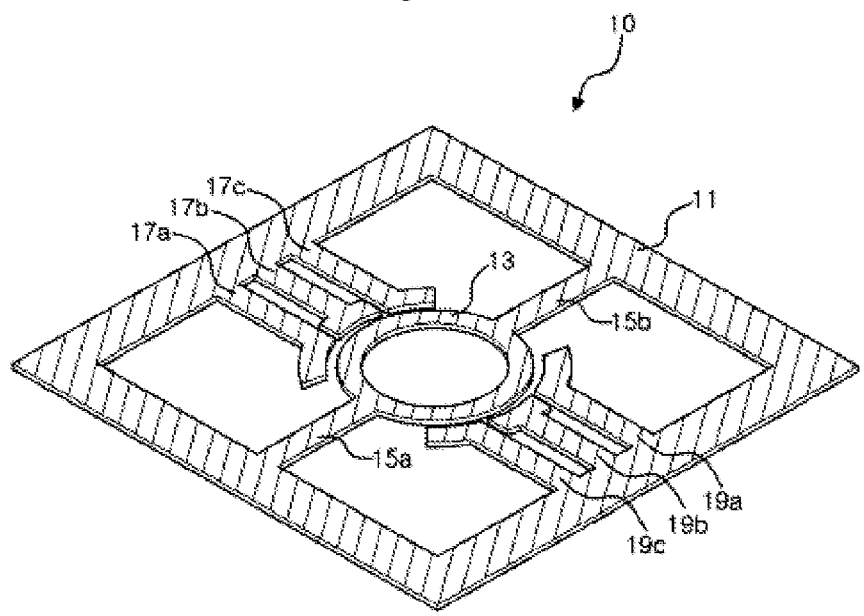
FIG. 2 is a perspective view showing a lead frame used in a UV LED package according to an embodiment of the present invention.

FIG. 2 is a perspective view showing a lead frame used in a UV LED package according to an embodiment of the present invention.

Referring to FIG. 2, a lead frame 10 has a heat sink support ring 13 into which a heat sink can be inserted. The heat sink support ring 13 may be formed in a circular ring shape as shown this figure. However, the heat sink support ring is not limited thereto, but may be formed in a polygonal ring shape.

Meanwhile, the heat sink support ring 13 is enclosed by an outer frame 11. The outer frame 11 is spaced apart from the heat sink support ring 13. The outer frame 11 may be formed in a square shape as shown in this figure. However, the outer frame is not limited thereto, but may be formed in a circular or polygonal shape.

The outer frame 11 and the heat sink support ring 13 are connected to each other through at least two connecting terminals 15a and 15b. The connecting terminals 15a and 15b, which may be positioned at opposite sides of the heat sink support ring 13, fix the heat sink support ring 13 to the outer frame 11. In addition to the connecting terminals 15a and 15b, additional connecting terminals may connect the heat sink support ring 13 and the outer frame 11 to each other.

At least two lead terminals 17a, 17b, 17c, 19a, 19b and 19c extend from the outer frame 11 towards the heat sink support ring 13. However, the lead terminals are spaced apart from the heat sink support ring 13. As shown in this figure, the lead terminals 17a, 17b, 17c, 19a, 19b and 19c may have a distal end with a wider area in the vicinity of the support ring 13. Meanwhile, it is preferable that the lead terminals be disposed at opposite sides of the heat sink support ring 13.

The required number of the lead terminals is determined considering the type and the number of UV LED chips to be mounted and a connecting method of bonding wires. However, the lead frame 10 preferably includes a large number of lead terminals in order to be used in various cases. As shown in this figure, the lead terminals may be disposed in a direction perpendicular to the connecting terminals 15a and 15b, so that a large number of lead terminals can be disposed in the same direction.

Meanwhile, although six lead terminals are shown in FIG. 2, fewer lead terminals may be disposed, or additional lead terminals may be further disposed. The additional lead terminals may be disposed in the same direction as the connecting terminals 15a and 15b.

The lead frame 10 may be fabricated by pressing a phosphorous bronze plate, which is copper alloy, with a die. Although one lead frame 10 is shown in FIG. 2, a plurality of lead frames 10 may be manufactured and arranged on a single phosphorous bronze plate. In particular, a plurality of lead frames 10 fabricated on a single phosphorous bronze plate are used to mass produce the light emitting diode packages.

Figure 3:
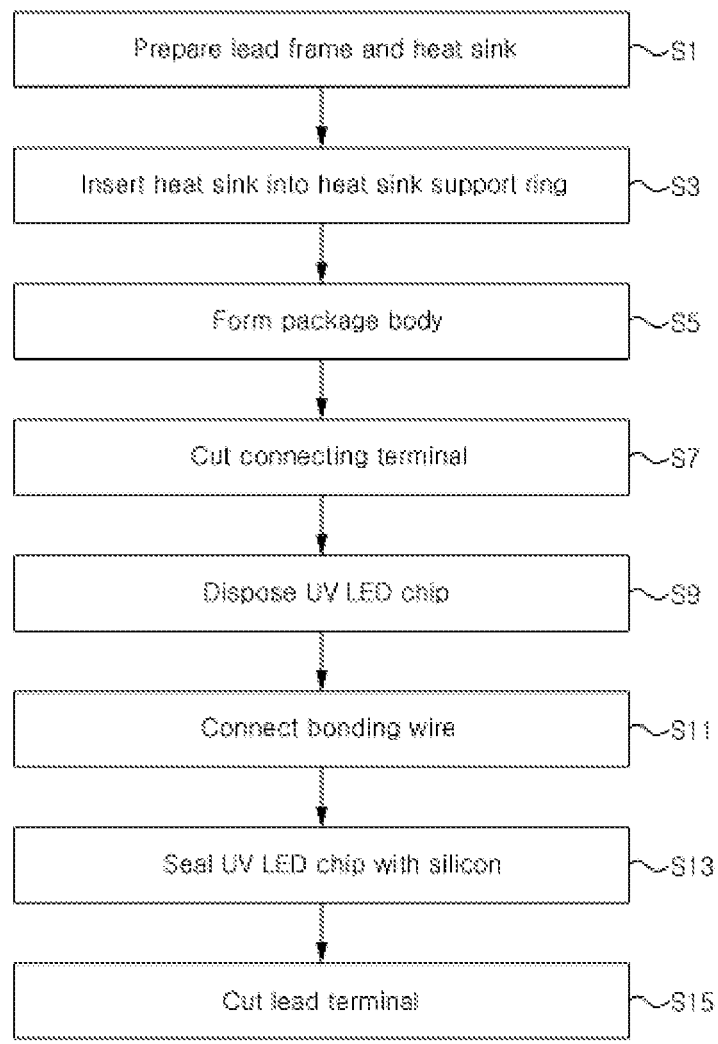
FIG. 3 is a flowchart illustrating a method of fabricating a UV LED package using the lead frame shown in FIG. 2.

FIG. 3 is a flowchart illustrating a method of fabricating a UV LED package according to an embodiment of the present invention, and FIGS. 4 to 10 are views illustrating the method of fabricating a UV LED package based on the flowchart in FIG. 3.

Referring to FIG. 3, the lead frame 10 described above with reference to FIG. 2 and a heat sink 20 are first prepared (S1).

As described above, the lead frame 10 is fabricated by pressing the phosphorous bronze plate, or a plurality of lead frames 10 may be fabricated and arranged on a single phosphorous bronze plate.

The heat sink 20 has an upper surface on which the UV LED chip is mounted. Preferably, the upper surface of the heat sink 20 is smaller than the inner diameter of the heat sink support ring 13 so that the heat sink is easily inserted into the support ring 13, and the side of the heat sink 20 has an outer diameter greater than the inner diameter of the heat sink support ring 13.

Further, the heat sink 20 may have a support ring reception groove 23a to be fastened to the heat sink support ring 13. Furthermore, the support ring reception groove 23a may be a spiral groove in order to be easily fastened to the heat sink support ring 13.

Meanwhile, the heat sink 20 may have a base 21 and a protrusion 23 protruding upward from a center portion of the base 21. At this time, the support ring reception groove 23a is formed on a side surface of the protrusion 23. Although the base 21 and the protrusion 23 may have a cylindrical shape, as shown in the figures, the base 21 and the protrusion 23 are not limited thereto, but may have a shape of a polygonal casing. The protrusion 23 is formed in the shape similar to an internal shape of the heat sink support ring 13, but the shape is not limited thereto. For example, the heat sink support ring 13 has a circular ring shape, and the protrusion 23 may have a rectangular casing shape.

The heat sink 20 may be made of metal having high thermal conductivity or thermal conductive resin through a pressing or molding technique. Further, the heat sink 20 is made through a separate process from those for the lead frame 10. Hence, one of the steps of preparing the lead frame 10 and the heat sink 20 may be first executed, or both the steps may be simultaneously executed.

Figure 4:
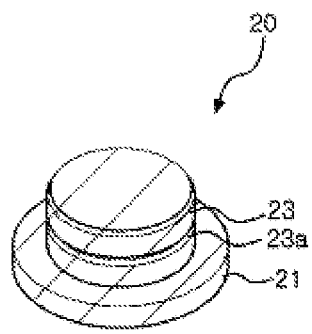
FIGS. 4 to 10 are views illustrating the method of fabricating a UV LED package based on the flowchart shown in FIG. 3.
Figure 5:
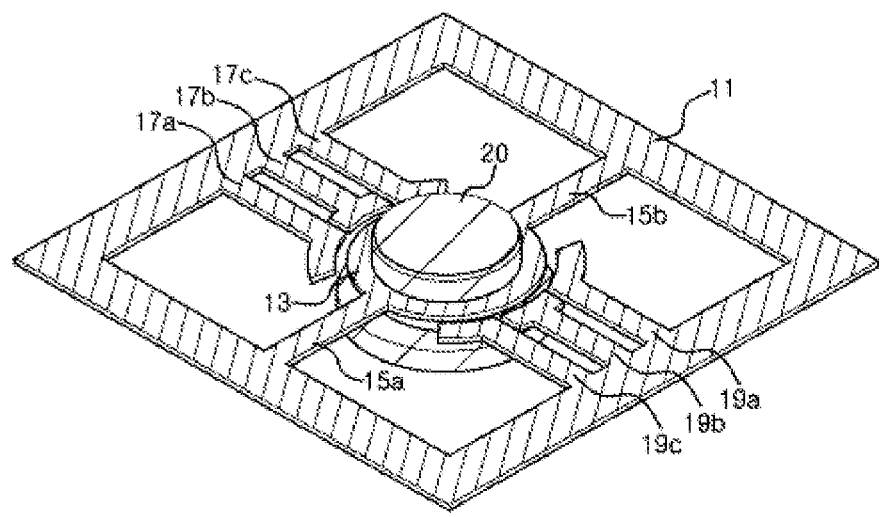

Referring to FIGS. 3, 4 and 5, the heat sink 20 is inserted into and fixed to the heat sink support ring 13 of the lead frame 10 (S3). Since the outer diameter of the side of the heat sink 20 is greater than the inner diameter of the heat sink support ring 13, the heat sink 20 can be forcibly fitted into and fixed to the support ring 13.

Meanwhile, when the heat sink is formed with the support ring reception groove 23a, the heat sink support ring 13 is accommodated in the support ring reception groove 23a to support the heat sink 20. At this time, it is preferable that a portion of the heat sink support ring 13 be accommodated in the support ring reception groove 23a, and the remaining portion of the support ring protrude outward from the protrusion 23, as shown in the figure. When the support ring reception groove 23a is a spiral groove, the heat sink 20 is inserted into the heat sink support ring 13 by rotating the heat sink 20.

Figure 6:
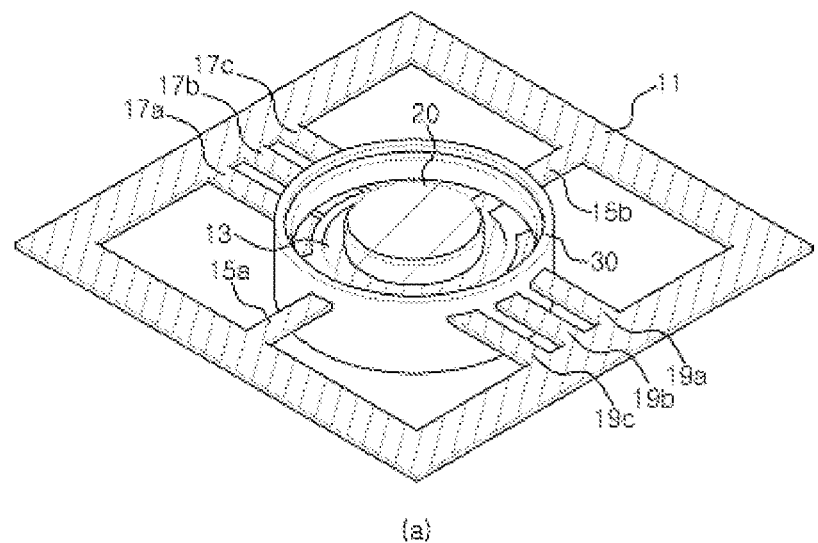
Figure 6:
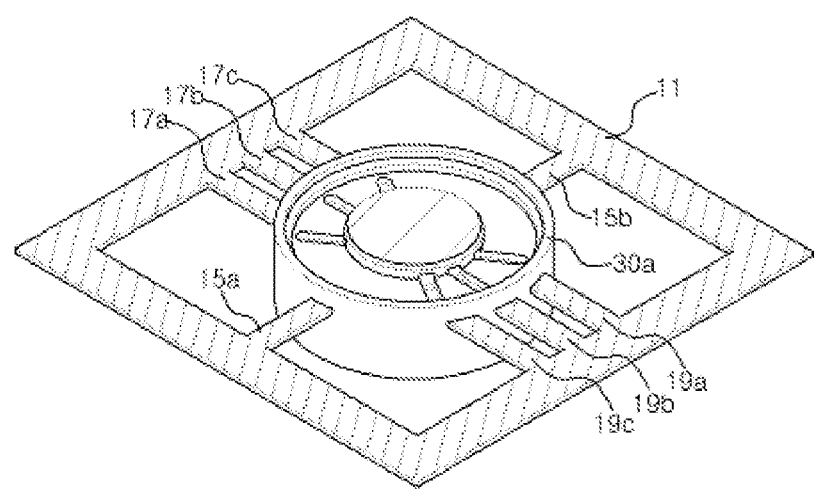

Referring to FIGS. 3 and 6 (a), after fixing the heat sink 20 to the lead frame 10, a region including the heat sink 20, portions of the lead terminals and portions of the connecting terminals is molded to thereby form a package body 30 (S5). At this time, the package body 30 may be formed using, for example, an insertion molding technique, which is not limited thereto. Further, the package body 30 may be formed of a thermosetting resin through an injection molding.

The package body 30 formed as described above supports the heat sink support ring 13 around the heat sink 20, the connecting terminals 15a and 15b, the lead terminals 17a, 17b, 17c, 19a, 19b and 19c, and the heat sink 20. At this time, the connecting leads and lead terminals partially protrude outward from the package body 30. Further, the package body 30 may have an opening that exposes an upper end of the heat sink 20 and the lead terminals.

As shown in FIG. 6 (a), the heat sink support ring 13 and portions of the lead terminals may be exposed through the opening. Hence, a groove is formed at an upper portion of the package body 30. Alternatively, as shown in of FIG. 6 (b), a package body 30a may cover most portions except for the upper end of the heat sink 20 and partially expose only the lead terminals. Thus, a plurality of openings may be formed.

In this case, it is preferable that a groove be also formed at an upper portion of the package body 30a as shown in FIG. 6 (b).

Further, a lower surface of the heat sink 20 may be exposed to the outside. In addition, a side of the base 21 may also be exposed. Accordingly, heat dissipation through the heat sink 20 can be accelerated.

Meanwhile, the package body 30 is formed in a cylindrical shape, as shown in FIGS. 6 (a) and (b). However, the package body is not limited thereto, but may be formed in the shape of a polygonal casing including a rectangular casing and the like.

Figure 7:
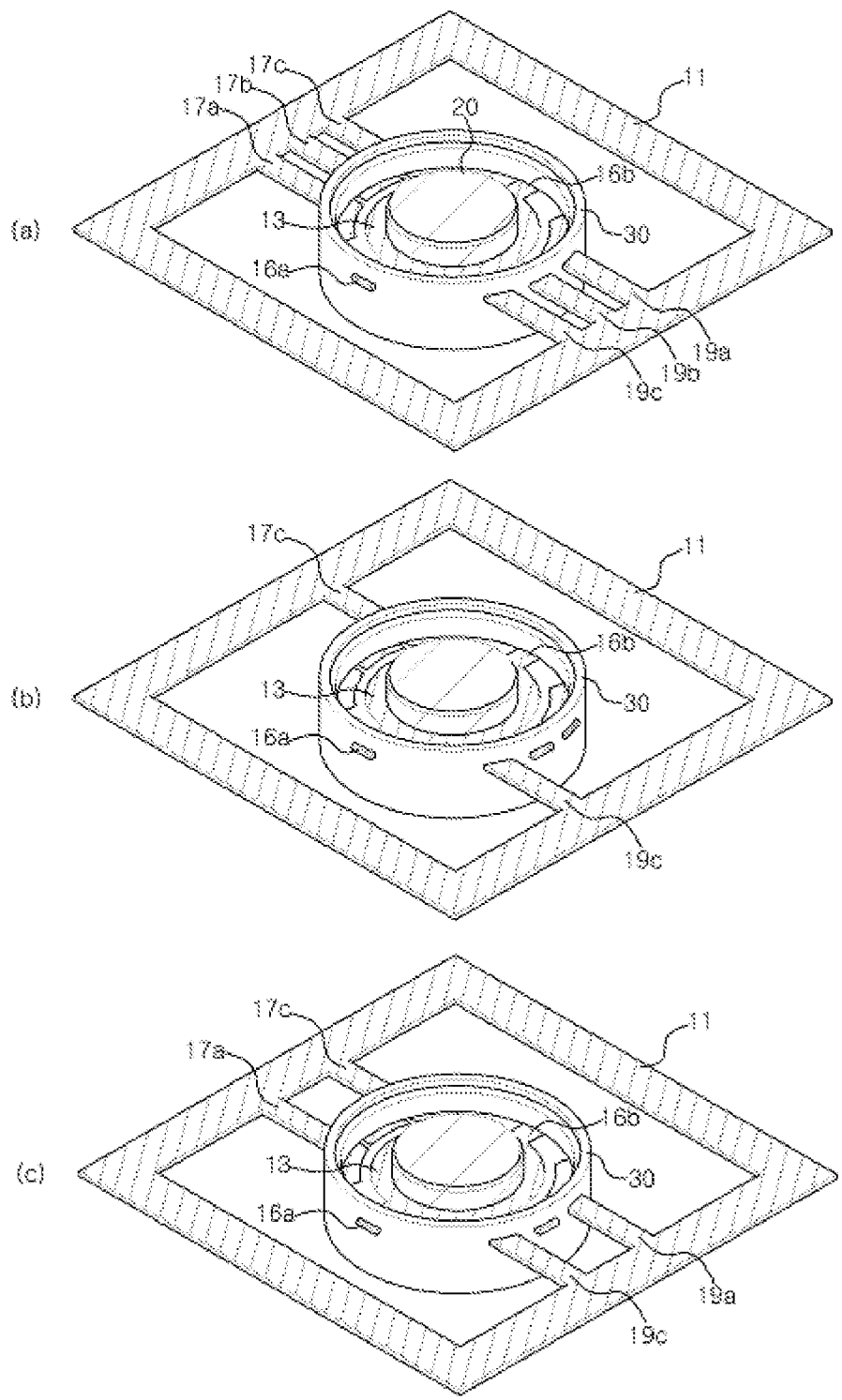

Referring to FIG. 3 and FIG. 7 (a), the connecting terminals 15a and 15b protruding outward from the package body 30 are cut and removed (S7). Consequently, the cut connecting terminals 16a and 16b are left in the package body 30, and the connecting terminals and the heat sink support ring 13 prevent the heat sink 20 from being separated from the package body 30.

Meanwhile, while the connecting terminals are cut, the lead terminals protruding outward from the package body 30 may be cut and removed except for the lead terminals that will be used as current paths. For example, when only the two lead terminals 17c and 19c are required as shown in FIG. 7 (b), the remaining lead terminals 17a, 17b, 19a and 19b are cut and removed. Further, when the four lead terminals 17a, 17c, 19a and 19c are required as shown in FIG. 7 (c), the remaining lead terminals 17b and 19b are cut and removed.

The process of cutting and removing lead terminals is performed when the number of lead terminals provided on the lead frame 10 is more than the number of lead terminals required for the LED package. Hence, if the number of lead terminals required for the LED package is equal to the number of lead terminals provided on the lead frame 10, the process of cutting and removing lead terminals may not be performed. Further, even if extra lead terminals are left out, they do not influence the operation of the LED package. Hence, the process of cutting and removing the extra lead terminals can be skipped.

Figure 8:
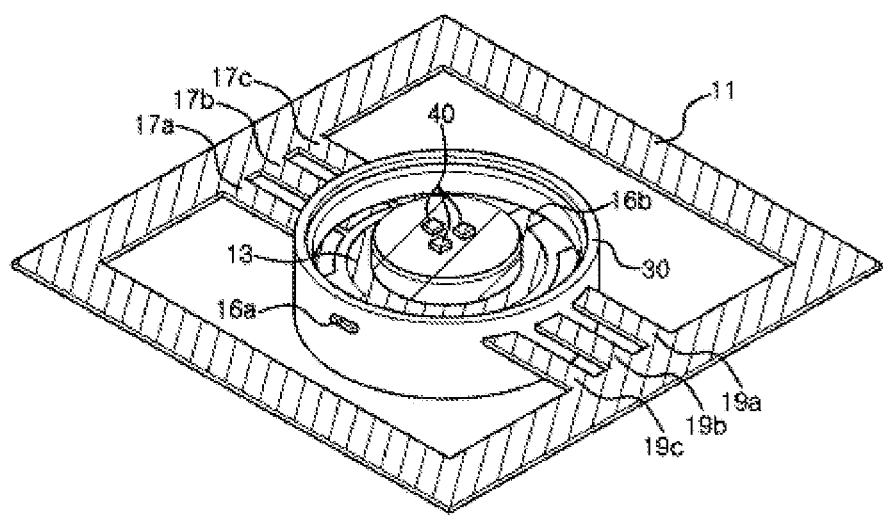

Referring to FIGS. 3 and 8, UV LED chips 40 are mounted on the upper surface of the heat sink 20 (S9). Each of the UV LED chips 40 may be a 1 (one) bond-chip having electrodes respectively formed on the upper and lower surfaces thereof or a 2 (two) bond-chip having two electrodes on the upper surface thereof.

If any one of the UV LED chips 40 is a 1 bond-chip, it is preferable that the heat sink 20 be made of conductive metal. At this time, the 1 bond-chip 40 may be mounted on the heat sink 20 through a conductive adhesive such as silver (Ag) epoxy. Alternatively, if all of the UV LED chips 40 are 2 bond-chips, the heat sink 20 need not be formed of conductive metal. The UV LED chips 40 may be mounted on the heat sink 20 through the silver (Ag) epoxy or other conductive adhesives.

Meanwhile, a plurality of UV LED chips 40 may be mounted on the heat sink 20. Further, the plurality of UV LED chips 40 may emit lights of different wavelengths.

Figure 9:
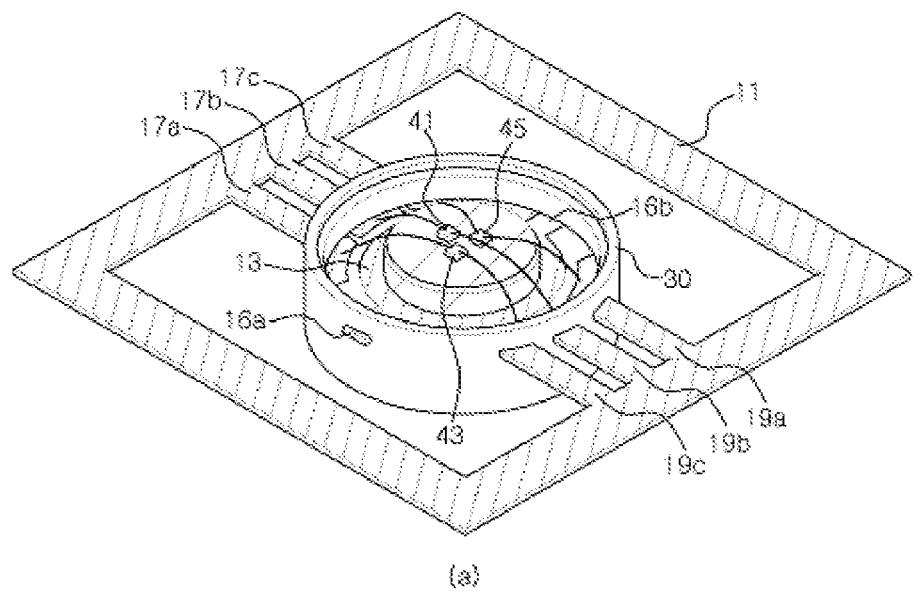
Figure 9:
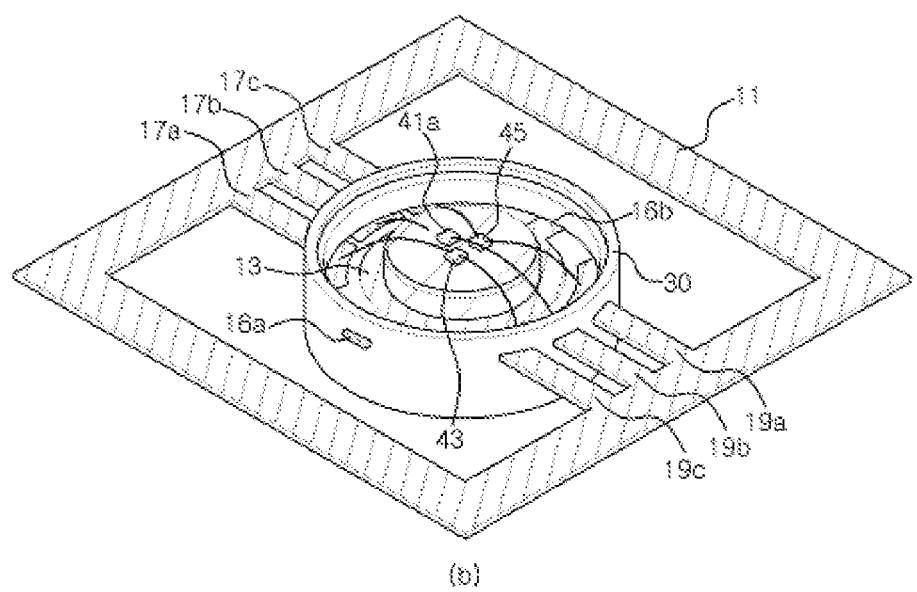

Referring to FIG. 3 and FIG. 9 (a), UV LED chips 41, 43 and 45 are electrically connected to the lead terminals 17a, 17b, 17c, 19a, 19b and 19c through bonding wires (S11). If the UV LED chips 41, 43 and 45 are 2 bond-chips, each of the UV LED chips 41, 43 and 45 is electrically connected to two of the lead terminals through two bonding wires. As shown in these figures, each of the UV LED chips 41, 43 and 45 may be electrically connected to a different pair of lead terminals. Further, one of the lead terminals (for example, 17b), as a common lead terminal, is electrically connected to the respective UV LED chips through bonding wires, and the other lead terminals (for example, 19a, 19b, 19c) opposite to the common lead terminal are electrically connected to the UV LED chips through other bonding wires. In this case, the UV LED chips 41, 43 and 45 can be operated by different currents, respectively.

Meanwhile, as shown in FIG. 9 (b), a 1 bond-chip 41a and 2 bond-chips 43 and 45 may be mounted together. At this time, the lead terminal 17b of the lead terminals is electrically connected to the heat sink 20 through a bonding wire. Hence, the lead terminal 17b is electrically connected to the lower surface of the 1 bond-chip 41a through the bonding wire and the heat sink 20. The combinations of the 1 and 2 bond-chips may vary, and a connecting method of bonding wires may be selected variously.

In addition, a connecting method of lead terminals and UV LED chips may be selected variously, and a plurality of UV LED chips may be connected to each other in series, parallel or series-parallel.

Meanwhile, after connecting the UV LED chips 41, 43 and 45 to the lead terminals through the bonding wires, the UV LED chips 41, 43 and 45 are sealed by a sealant that is a protective member made of silicon (S13). The opening of the package body 30 is filled with the sealant made of silicon to seal the UV LED chips and the bonding wires. The sealant made of silicon can prevent a yellowing phenomenon of an epoxy sealant mainly used for a UV LED package.

As described above, the sealant made of silicon, which is a material having a non-yellowing property to energy (particularly, heat energy) from an LED chip, may not contain a phosphor. In the present invention, if the sealant made of silicon does not contain phosphor, the LED package of the present invention can be used in the fields including sterilization, purification, medical treatment and the like. In addition, the sealant made of silicon may further contain a diffusion material. The diffusion material diffuses the light emitted from the UV LED chips to uniformly emit the light outward.

After the UV LED chips 41, 43 and 45 are sealed by the sealant made of silicon, a lens (not shown) may be formed on the package body 30. The lens is used to emit the light in a constant directional angle range, and may be omitted if it is not required. In particular, the sealant made of silicon may be cured in a lens shape to function as the lens. In this case, a process of attaching a lens may be skipped.

Figure 10:
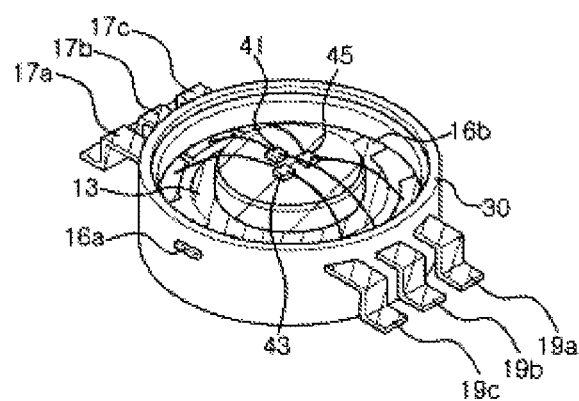

Referring to FIGS. 3 and 10, the lead terminals 17a, 17b, 17c, 19a, 19b and 19c are cut from the outer frame 11 (S15). In the present invention, end portions of the cut lead terminals 17a, 17b, 17c, 19a, 19b and 19c may be bent to have a shape suitable for surface mounting. Meanwhile, step S7 of cutting and removing the connecting terminals may be performed together with this step S15.

Hereinafter, the UV LED package according to the embodiment of the present invention will be described in detail with reference to FIG. 10.

Referring to FIG. 10, the UV LED package includes the heat sink support ring 13. The heat sink support ring 13 may be made of copper alloy such as phosphorous bronze. The heat sink support ring 13 is formed in a circular ring shape, which is not limited thereto but may be formed in a polygonal ring shape. The cut connecting terminals 16a and 16b extend outward from the heat sink support ring 13. The cut connecting terminals 16a and 16b may be disposed at the opposite sides of the heat sink support ring 13.

The heat sink 20, which is described with reference to FIG. 4, is inserted into the heat sink support ring 13.

Meanwhile, at least two lead terminals 17a, 17b, 17c, 19a, 19b and 19c are disposed at both the sides of the heat sink support ring 13 and are spaced apart from the heat sink support ring 13 and the heat sink 20. The lead terminals 17a, 17b, 17c, 19a, 19b and 19c may be positioned at both sides opposite to each other with respect to the heat sink support ring 13. The lead terminals 17a, 17b, 17c, 19a, 19b and 19c are disposed in the direction perpendicular to the cut connecting terminals 16a and 16b, so that a large number of lead terminals can be disposed in the same direction. Further, the lead terminals may be bent to be surface mounted.

In addition, the package body 30 is molded to support the heat sink 20 and the lead terminals. The package body 30 has an opening on the upper portion thereof to expose the upper end of the heat sink 20 and portions of the lead terminals. Meanwhile, the lead terminals at least partially penetrate a sidewall of the package body 30 and protrude outward.

As described with reference to FIG. 6 (a), the heat sink support ring 13 and the connecting terminals 15a and 15b are partially exposed through the opening. Hence, the upper portion of the package body 30 is formed with the groove. Further, as described with reference to FIG. 6 (b), the package body (30a in FIG. 5 (b)) may cover most portions except for the upper end of the heat sink 20 and partially expose only the lead terminals. Hence, a plurality of openings may be formed. In this case, it is preferable that a plurality of grooves be formed on the upper portion of the package body 30a, as shown in FIG. 6 (b).

The package body 30 may be a plastic resin formed by an injection molding of thermosetting resin after the heat sink 20 is inserted into and fixed to the heat sink supporting ring 13.

Meanwhile, the UV LED chips 41, 43 and 45 are mounted on the upper surface of the heat sink 20. Although the UV LED chips shown in FIG. 10 or LED dies are 2 bond-chips, the present invention is not limited thereto. That is, the LED dies may be any one of 1 bond-chips or combination of the 1 and 2 bond-chips.

The UV LED chips are electrically connected to the lead terminals through the bonding wires. If the UV LED chips are the 2 bond-chips, each of the UV LED chips is electrically connected to two of the lead terminals through two of the bonding wires. Meanwhile, if at least one of the UV LED chips is the 1 bond-chip, the heat sink is electrically connected to at least one of the lead terminals through the bonding wire.

A connecting method of the UV LED chips and the lead terminals may vary, and be selected depending on the desired characteristics of the UV LED package.

Meanwhile, the UV LED chips are sealed by the sealant (not shown) made of silicon. The grooves formed on the upper portion of the package body 30 are filled with the sealant made of silicon. Further, the sealant made of silicon may not contain a phosphor but contain a diffusion material. The sealant made of silicon may be formed in a lens shape.

Figure 11:
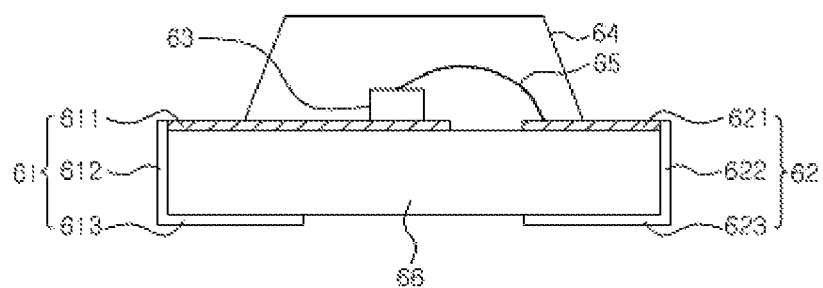
FIGS. 11 and 12 are views illustrating UV LED packages according to other embodiments of the present invention.

FIG. 11 is a view of a UV LED package of a chip structure according to another embodiment of the present invention.

Referring to FIG. 11, the UV LED package comprises a base plate 66, a first lead terminal 61 formed on one end of the base plate 66, and a second lead terminal 62 formed on the other end of the base plate 66 to be spaced apart from the first lead terminal 61 at a predetermined interval.

The first lead terminal 61 comprises an upper surface 611 formed on the base plate 66, i.e., on a portion where an LED chip 63 is mounted, a side surface 612 formed on a side of the base plate 66, and a lower surface 613 formed under the base plate 66. The first lead terminal 61 can be generally formed in the shape of " ⌐ ". At this time, the first lead terminal 61 may have the shape of a heat pipe, through which heat can be easily dissipated, therein. Further, the second lead terminal 61 comprises an upper surface 621 formed on the base plate 66, a side surface 622 formed on a side of the base plate 66, and a lower surface 623 formed under the base plate 66. The second lead terminal 62 can be generally formed in the shape of " ⌐ ".

At this time, the upper surface 611 of the first lead terminal 61 and the upper surface 612 of the second lead terminal 62 may be formed of a material with high reflection efficiency so as to enhance the reflection efficiency of light emitted from the LED chip 63. Reflective layers may be formed on the upper surfaces 611 and 612.

The first lead terminal 61 functions as a heat dissipation member. The LED chip 63 can be mounted on the upper surface 611 of the first lead terminal 61 and electrically connected to the second lead terminal 62 through a wired 65. The UV LED package may include a sealant 64 made of silicon for sealing the LED chip 63, the wire 65 and at least portions of the reflective layers.

Further, the sealant 64 made of silicon may not contain a phosphor but may contain a diffusion material. The sealant 64 made of silicon may be formed in a lens shape.

Figure 12:
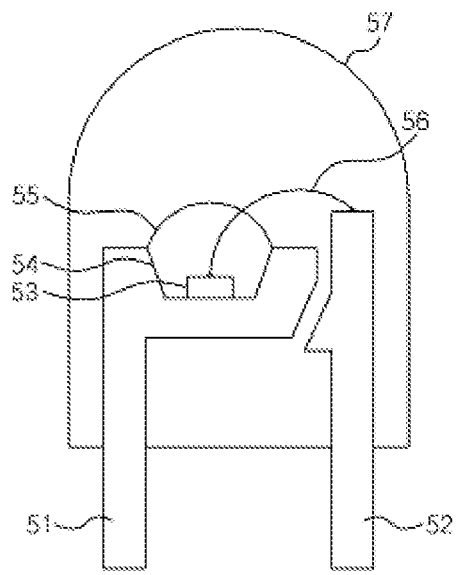

FIG. 12 is a sectional view of a UV LED package of a lamp structure according to an additional embodiment of the present invention.

Referring to FIG. 12, the UV LED package comprises a first lead terminal 51 and a second lead terminal 52 spaced apart from the first lead terminal 51 at a predetermined interval. The first lead terminal 51 functions as a heat dissipation member. At this time, the first lead terminal 51 may have the shape of a heat pipe, through which heat can be easily dissipated, therein. The first lead terminal 51 has a groove portion formed in a predetermined region of an upper portion thereof. A reflective layer 54 with a predetermined slope can be formed on a sidewall surface of the groove portion. Various kinds of metals with superior reflectivity may be used as the reflective layer 54. In particular, in case of a UV LED, it is preferable that Al be used as the reflective layer 54. This is because it is possible to prevent UV from being absorbed in the reflective layer 54.

An LED chip 53 can be disposed in the groove portion of the first lead terminal 51 and electrically connected to the second lead terminal 52 through a wire 56. The UV LED package can include a sealant 55 made of silicon for sealing the LED chip 53, the wire 56 and the reflective layer 54, and an outer molding member 57 formed in a front end portion of the lead terminals 51 and 52.

Further, the sealant made of silicon may not contain a phosphor but may contain a diffusion material. The sealant made of silicon may be formed in a lens shape.

Hereinafter, other various embodiments of a UV LED package of a more improved lamp structure will be described in detail, which includes an LED chip emitting light with a peak wavelength of 350 nm or less and a non-yellowing material, i.e., glass, quartz or silicon resin, for protecting the LED chip.

Figure 13:
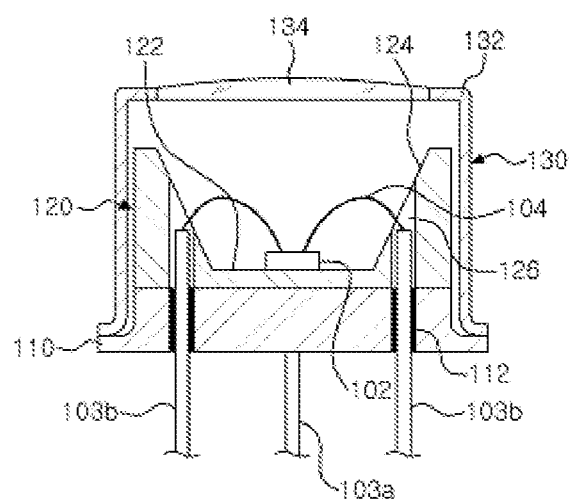
FIG. 13 is a sectional view showing a UV LED package according to a further embodiment of the present invention.
Figure 14:
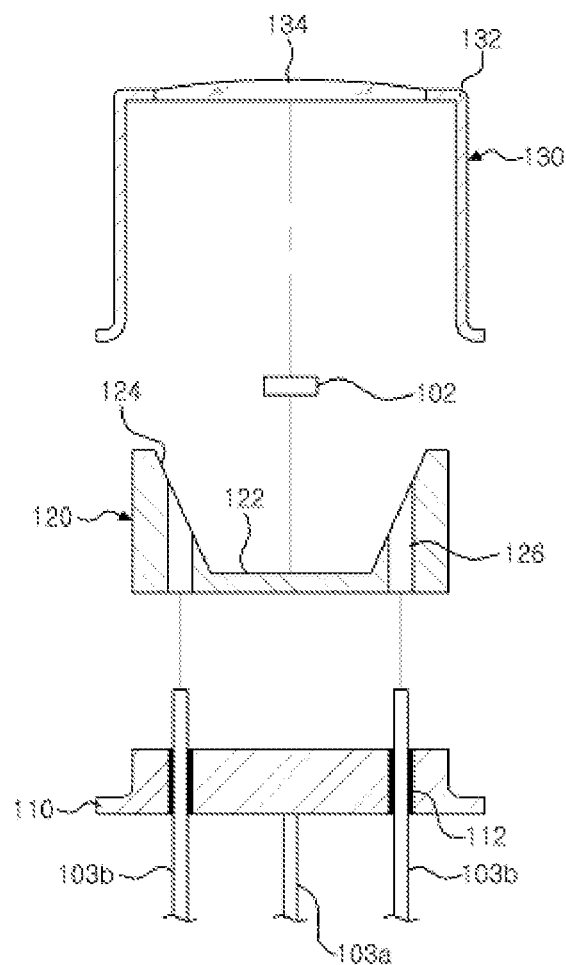
FIG. 14 is an exploded view of the UV LED package shown in FIG. 13.

FIGS. 13 and 14 are respectively sectional and exploded views of a UV LED package according to a further embodiment of the present invention.

Referring to FIGS. 13 and 14, the UV LED package includes an LED chip 102 emitting light with a peak wavelength of 350 nm or less. In this specification, the term "LED chip" means not only an LED chip itself but also an LED chip having a submount mounted thereon.

The UV LED package has a lamp structure in which external power is applied through pin-type leads 103a and 103b and bonding wires 104. Further, the UV LED package comprises a base 110, a protective cup 120 attached on the base 110, and a cap-shaped protective member 130 put on the protective cup 120 and adhering thereto. Preferably, the base 110 is formed of a metallic material with excellent electrical and thermal conductivity. More preferably, the base 110 is formed of Ag, Au, Al or alloy thereof; or a material coated with Ag, Au, Al or alloy thereof.

The first lead 103a adheres directly to a bottom surface of the base 110. Since the first lead 103a is electrically connected to the reflective cup 120 on the base 110, the first lead 103a can be also connected electrically to a first electrode (not shown) of the LED chip 102 mounted to the reflective cup 120. The base 110 has a structure in which at least one (two in this embodiment) second lead 103b can pass therethrough. An insulative adhesive 112 is provided in a hole through which the second lead 103b passes to fix the second lead 103b. At this time, the reflective cup 120 to which the LED chip 102 is mounted and the base 110 electrically and thermally connected to the reflective cup 120 can function as heat dissipation members.

The reflective cup 120 made of a material, such as Al or an alloy thereof, with superior conductivity and reflectivity is mounted on the base 110. The reflective cup 120 comprises a bottom portion 122 and a side inclined portion 124 formed around the bottom portion 122. The bottom portion 122 is attached to the base 110 at a bottom surface thereof. The LED chip 102 is attached to a top surface of the bottom portion 122. The side inclined portion 124 surrounds a circumference of the LED chip 102, thereby preventing light from being disappeared or lost, for example, in an inner surface of a cap 132. In this embodiment, the reflective cup 120 is entirely formed of an aluminum material. However, the reflective cup 120 may be entirely formed of or partially coated with another light reflective material except the aluminum material.

The reflective cup 120 has lead holes 126 for accommodating the second leads 103b which pass through the base 110 and extend. At this time, the lead hole 126 is defined in a portion of the side inclined portion 124 of the reflective cup 120. Accordingly, the lead hole 126 is partially formed in the side inclined portion 124 having a relatively broader area, so that it is possible to prevent reduction of the area of the bottom portion 122, which becomes a rear reflection area of light and to which the LED chip 102 is attached. At this time, the bonding wire 104, particularly, a bonding wire made of an Au material, connects an end of the second lead 103b accommodated by the lead hole 126 and a second electrode (not shown) of the LED chip 102.

A cap-shaped protective member 130 is fixed to and mounted on the reflective cup 120. In this embodiment, the protective member 130 comprises a cap 132 and a lens 134. The cap 132 has a bottom end opened and is attached to a top surface of the base 110 at the opened bottom end. Preferably, the cap 132 is formed of a metallic material coated with Al, Ag or Au. The lens 134 is formed of a glass material with superior light property and high strength, preferably a quartz material, and is fixed to and placed on an upper end of the cap 132. The cap-shaped protective member 130 is mounted to the base 110 while surrounding the reflective cup 120 and the LED chip 102. The interior of the protective member 130 is filled with $N_2$ or air. At this time, it is preferable that the lens 134 of the protective member 130 be designed to have the size and position so that all light reflected from the reflective cup 120 can be substantially emitted. In this embodiment, the diameter of the lens 134 is designed to be approximately equal to the inner diameter of an upper end of the reflective cup 120.

Like the sealant made of silicon in the aforementioned embodiment, the protective member 130 of this embodiment also has a non-yellowing property. The reason is that a lens itself made of a glass or quartz material has a non-yellowing property to heat from an LED chip, and is spaced apart from the LED chip by $N_2$ or air.

In the UV LED package of this embodiment, the reflective cup 120 prevents light from reaching an inner surface of the cap 132 that may cause light loss. This is made possible since the reflective cup 120 concentrates light and reflects it toward the lens 134.

Figure 15:
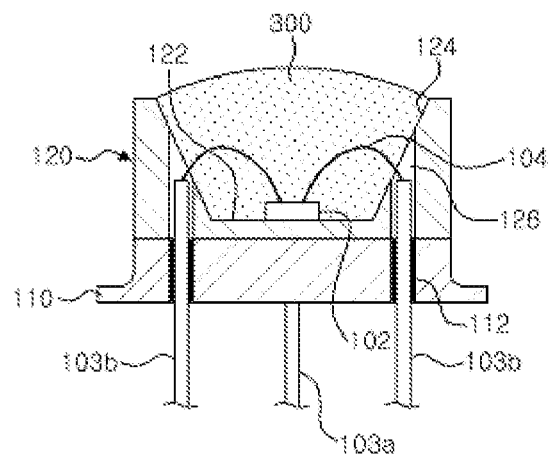
FIG. 15 is a sectional view showing a UV LED package according to a still further embodiment of the present invention.

FIG. 15 is a sectional view showing a UV LED package according to a still further embodiment of the present invention. The UV LED package shown in FIG. 15 is substantially the same as the aforementioned embodiment except the configuration of the protective member. Therefore, descriptions overlapping with the aforementioned embodiment will be omitted below.

Referring to FIG. 15, the UV LED package of this embodiment has a non-yellowing protective member 300 formed of silicon resin solely. The silicon resin has no yellowing phenomenon caused by UV light. The protective member 300 formed of the silicon resin is formed by filling a reflective cup 120 with liquid silicon and then curing the liquid silicon. In the UV LED package of this embodiment, the silicon resin used to form the protective member 300 is resin having a dimensional stability lower than typical epoxy resin. Nevertheless, the shape and dimension of the reflective cup 120 is confined by the inner shape thereof, so that the reflective cup 120 can be formed to have desired shape and dimension. Since reflective surfaces of the reflective cup 120 that is in contact with the silicon resin serve to reflect light toward a top surface of the protective member 300 without light loss, it is possible to obtain more enhanced light radiation efficiency. Additionally, a time for forming a lens (molding member) made of resin is reduced in that the silicon resin has a curing time shorter than epoxy resin. Accordingly, the silicon resin can be contributed to reducing a time for manufacturing the package.

Figure 16:
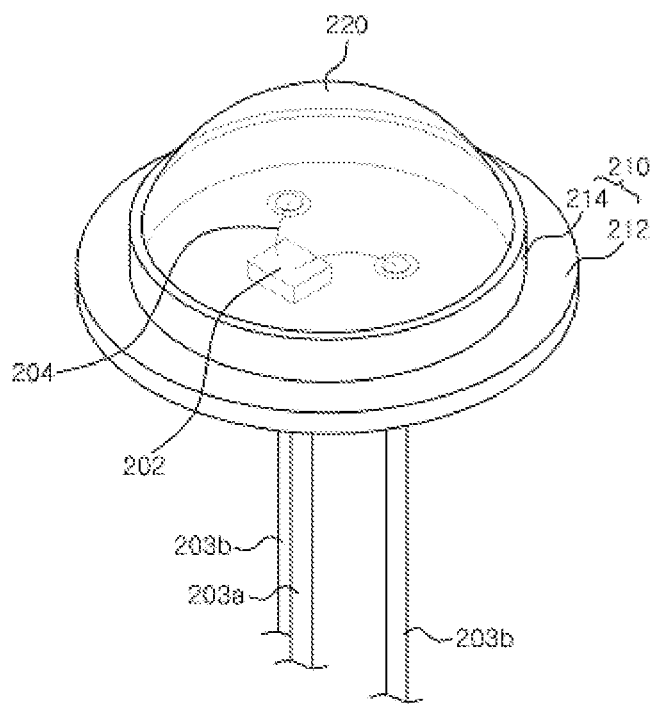
FIG. 16 is a perspective view showing a UV LED package according to a still further embodiment of the present invention.
Figure 17:
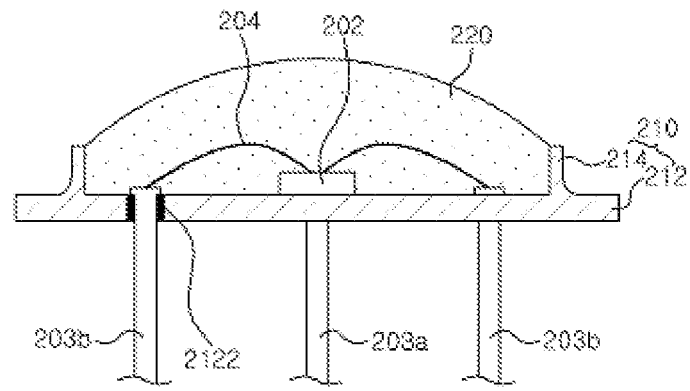
FIG. 17 is a sectional view showing the UV LED package shown in FIG. 16.

FIGS. 16 and 17 are respectively perspective and sectional views showing a UV LED package according to a still further embodiment of the present invention.

Referring to FIGS. 16 and 17, the UV LED package includes an LED chip 202 for emitting light with a peak wavelength of 350 nm or less. Further, the UV LED package has a lamp structure in which external power is applied through pin-type leads 203a and 203b and bonding wires 204.

According to this embodiment, the UV LED package includes a lamp body 210 formed of a metallic material. The lamp body 210 comprises a base 212 and a ring-shaped fence portion 214 formed to have a stepped structure on a top surface of the base 212. At this time, the lamp body 210 is preferably formed of a metallic material with superior electrical and thermal conductivity. More preferably, the lamp body 210 is formed of Ag, Au, Al or an alloy thereof, or a metallic material partially coated with the aforementioned metals.

A first pin-type lead 203a is directly attached to a bottom surface of the base 212. Since the base 212 is made of a material with superior electrical conductivity, a first electrode (not shown) of the LED chip 202 mounted on the base 212 and the first pin-type lead 203a are electrically connected to each other through the base 212. Since the base 212 has excellent heat conductivity, the base 212 can function as a heat dissipation member for dissipating heat of the LED chip 202 to the outside.

Further, the base 212 has a structure in which at least one (two in this embodiment) second pin-type lead 203b can pass through the base 212. An insulative adhesive 2122 is provided in a hole through which the second pin-type lead 203b passes in order for the insulative adhesive to fix the second pin-type lead 203. The fence portion 214 on the top surface of the base 212 defines a space in which the LED chip 202 is mounted, and provides a mold of a silicon molding member 220, which will be described below. The second pin-type lead 203b is connected to a second electrode (not shown) of the LED chip 202 through the bonding wire, preferably a bonding wire made of an Au material.

Meanwhile, the silicon molding member 220 confined and formed by the fence portion 214 with a stepped structure covers the LED chip 202 in a low depth. Accordingly, it is possible to minimize the amount of light which is produced from the LED chip 202 and bumps into an inner surface of the fence portion 214. The silicon molding member 220 is formed by injecting liquid silicon resin into the fence portion 214 with a syringe or the like and then curing the liquid silicon resin. At this time, the silicon molding member 220 has a curved light emitting surface formed to be convex in a light emitting direction due to surface tension, thereby enhancing light emitting efficiency on the light emitting surface. As the most preferred embodiment of the present invention, the light emitting surface of the silicon molding member is formed to be convex. However, the light emitting surface may be formed to be concave or flat.

The silicon resin for forming the silicon molding member 220 is deteriorated in dimensional or shape stability in a transfer molding method as compared with conventional epoxy resin used for forming a molding member. However, a disadvantage related to the aforementioned dimensional or shape stability can be eliminated using a molding method in which liquid silicon resin is injected into the fence portion 214. Additionally, a time for forming a molding member made of resin can be reduced in that the silicon resin has a curing time shorter than epoxy resin. Accordingly, the silicon resin can be contributed to reducing a time for manufacturing the package.

It is described in this embodiment that the lamp body 210 provided with a structure, in which the base 212 and the fence portion 214 are integrally formed of a metallic material, and the three pin-type leads 203a and 203b are used. However, the base 212 and the fence portion 214 may be formed of different materials from each other. Three pin-type leads are not necessarily used, but two or more pin-type leads may be sufficiently used.

Figure 18:
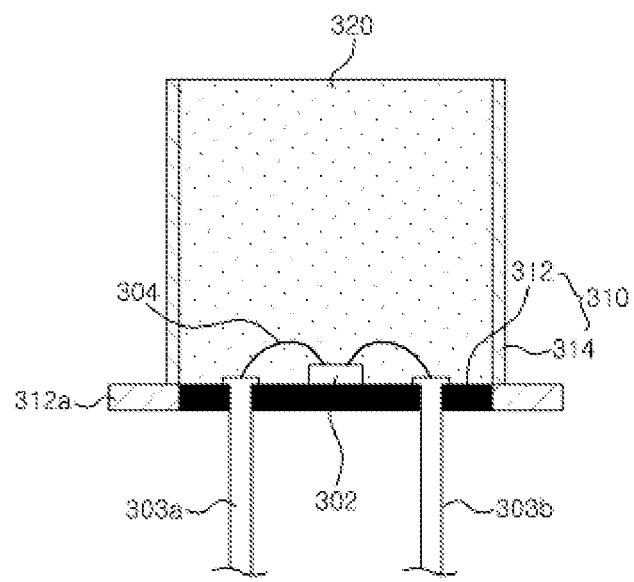
FIG. 18 is a sectional view showing a UV LED package according to a still further embodiment of the present invention.

FIG. 18 is a sectional view showing an ultraviolet LED package according to a still further embodiment of the present invention, in which a base and a fence portion are formed of different materials and two pin-type leads are provided.

Referring to FIG. 18, a lamp body 310 has a base 312 made of insulation, confined and formed inside a ring-shaped support portion 312a. In addition, a tube-shaped fence portion 314 defining a space in which an LED chip 302 is mounted is provided on the base 312. In this embodiment, the fence portion 314 has a tube structure in which upper and lower portions of the fence portion 314 are opened. The lower portion is bonded to and supported by the support portion 312a, and the upper portion is opened for the purpose of light emission. The tube-shaped fence portion 314 is provided to have a height so that a silicon molding member 320 can be formed to have a sufficient depth. Preferably, the fence portion 314 is made of an aluminum material with an excellent reflection property.

The base 312 is configured to allow first and second pin-type leads 303a and 303b to pass therethrough, and to be fixed thereto. The first and second pin-type leads 303a and 303b are electrically connected, at ends thereof, to first and second electrodes (not shown) of the LED chip 302 through bonding wires 304, respectively.

Figure 19:
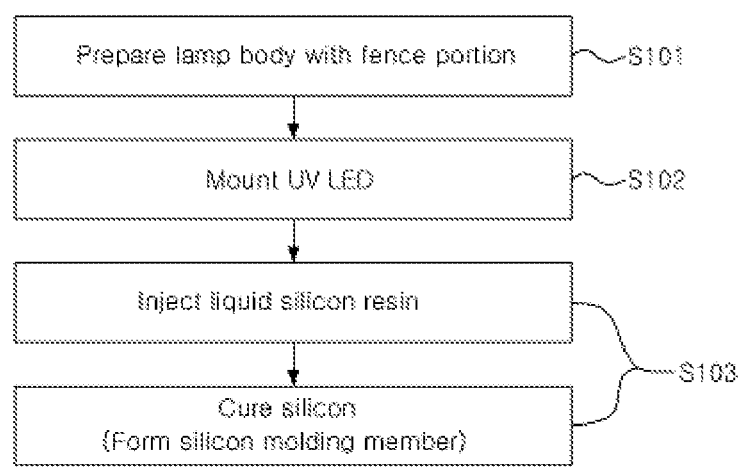
FIG. 19 is a flowchart illustrating a method of fabricating the UV LED package shown in FIGS. 16 to 18.

FIG. 19 is a flowchart illustrating a method of fabricating the UV LED package described above.

As shown in FIG. 19, the method of fabricating the UV LED package according to this embodiment comprises step S101 of preparing a lamp body, step S102 of mounting an LED, and step S103 of forming a silicon molding member.

In step S101 of preparing a lamp body, a lamp body 210 having a metal integrated structure is prepared as shown in FIGS. 16 and 17, or a lamp body 210 having an assembled structure is prepared as shown in FIG. 18. As shown FIGS. 16 to 18, the lamp body 210 is formed to have a base 212 or 312 to which an LED chip 202 or 302 is attached, and a fence portion 214 or 314 for surrounding a circumference of the LED chip 202 or 302. At this time, the process of mounting pin-type leads 203a and 203b or 303a and 303b may be performed in step S101 of preparing a lamp body or in step S102 of mounting an LED chip, which will be described below.

Then, in step S102 of mounting an LED chip, the LED chip 202 or 302 is attached on the base 212 or 312 positioned inside the fence portion 214 or 314 of the lamp body 210 or 310. A wire connecting process is performed using bonding wires before or after the mounting process.

Thereafter, step S103 of forming a silicon molding member 220 or 320 inside the fence portion 214 or 314 is performed. In this step, the process of filling the fence portion 214 or 314 with silicon resin is performed. At this time, a syringe (not shown) or a liquid injector (not shown) in an automation device may be used in the filling process. After filling the fence portion 214 or 314 with liquid silicon resin, the liquid silicon resin is cured. The cured silicon resin may be formed into the silicon molding member 220 shown in FIGS. 16 and 17, or the silicon molding member 230 shown in FIG. 18.

Figure 20:
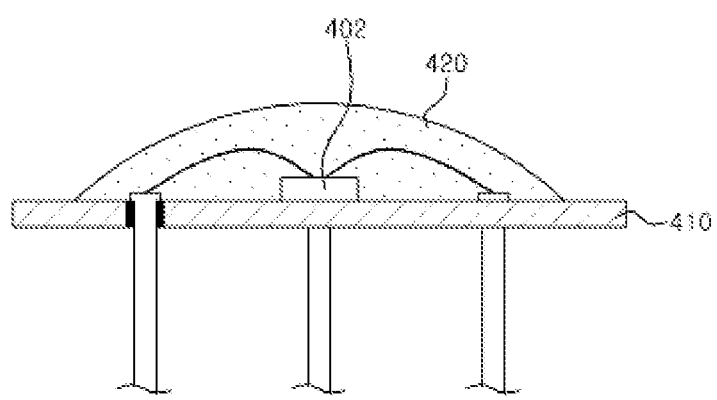
FIG. 20 is a sectional view showing a UV LED package according to a still further embodiment of the present invention.

FIG. 20 shows an UV LED package according to a still further embodiment of the present invention. Referring to FIG. 20, a lamp body 410 of this embodiment has only a base provided with an entirely flat structure in which pin-type leads are attached and assembled to pass through the lamp body 410, but the fence portion described in the aforementioned embodiment is removed. An LED chip 402 is attached on a top surface of the base of the lamp body 410 as described in FIGS. 17 and 18. Further, liquid silicon resin is put on the top surface of the base to cover the LED chip 402. At this time, the liquid silicon resin can cover the LED chip 402 while maintaining a curved surface due to surface tension. Preferably, a phosphor for adjusting color of light is contained in a silicon molding member 420. In this embodiment, the phosphor in the form of powder is contained in the silicon molding member 420 by being previously mixed with liquid silicon. However, this configuration does not limit the present invention.

What is claimed is:

1. An ultraviolet light emitting diode (UV LED) assembly, comprising:
   a base;
   a reflective cup arranged on the base and comprising a bottom portion and a side inclined portion;
   an LED chip arranged on the bottom portion of the reflective cup; and
   a protective member arranged on the reflective cup,
   wherein the protective member comprises a cap comprising an upper surface comprising an opening, and a lens disposed in the opening, and
   wherein the diameter of the lens is approximately equal to the inner diameter of an upper end of the reflective cup.

2. The UV LED assembly of claim 1, wherein the lens comprises a glass material.

3. The UV LED assembly of claim 2, wherein the lens comprises quartz.

4. The UV LED assembly of claim 1, further comprising:
   a first lead hole formed in the side inclined portion of the reflective cup; and
   a lead that extends through the base and the first lead hole.

5. The UV LED assembly of claim 1, wherein the reflective cup comprises aluminum.

6. The UV LED assembly of claim 1, wherein the reflective cup comprises a heat dissipation member.

7. The UV LED package as claimed in claim 6, wherein the heat dissipation member comprises:
   a groove portion provided on an upper portion thereof, the LED chip being mounted in the groove portion; and
   a sidewall surface of the groove portion is inclined.

8. The UV LED assembly of claim 1, wherein light is configured to pass directly from the LED chip through the lens to the outside of the UV LED assembly.

9. The UV LED assembly of claim 1, wherein the opening in the upper surface of the cap comprises substantially non-curved sides.

10. The UV LED assembly of claim 9, wherein the lens comprises substantially non-curved sides contacting the cap sides in the opening.

11. The UV LED assembly of claim 1, wherein the interior of the protective member is filled with $N_2$ or air.

12. The UV LED assembly of claim 1, wherein the cap and the lens are exposed to the outside of the UV LED apparatus.

13. The UV LED assembly of claim 1, wherein the cap comprises an open bottom end.

14. The UV LED assembly of claim 1, wherein the cap comprises a metallic material.

15. The UV LED assembly of claim 1, wherein the lens contacts the cap in the opening.

16. An ultraviolet light emitting diode (UV LED) assembly, comprising:
   a base;
   a reflective cup arranged on the base and comprising a bottom portion and a side inclined portion;
   an LED chip arranged on the bottom portion of the reflective cup; and
   a protective member arranged on the reflective cup,
   wherein the protective member comprises a cap and a lens, the cap and the lens being exposed to the outside of the UV LED apparatus, and
   wherein the diameter of the lens is approximately equal to the inner diameter of an upper end of the reflective cup.

* * * * *